United States Patent

Kladde

[15] 3,662,278

[45] May 9, 1972

[54] AUTOMATIC PHASE CONTROL CIRCUIT FOR TV SYSTEM

[72] Inventor: Gerhard A. Kladde, Westport, Conn.

[73] Assignee: The United States of America as represented by the Secretary of the Navy

[22] Filed: Sept. 16, 1970

[21] Appl. No.: 72,680

[52] U.S. Cl. ....................331/17, 331/8

[51] Int. Cl. ....................H03b 3/04

[58] Field of Search ....................332/30; 331/36, 36 C, 1, 8, 331/34, 17

[56] References Cited

UNITED STATES PATENTS 3,249,876 5/1966 Harrison ....................331/36

*Primary Examiner*—John Kominski

*Attorney*—R. S. Sciascia and H. H. Losche

[57] ABSTRACT

An automatic phase control circuit to synchronize the frequency and phase of a TV system having a discriminator to produce an error signal from the discrimination of the TV sync signal frequency and the frequency from a reference local oscillator to develop, through buffer amplifiers and a unijunction negative resistance control source or through operational amplifiers and a varactor bridge, a zero phase signal, a null signal, or an out-of-phase signal to control the effective capacitive reactance of an L–C tank circuit coupled to control the reference local oscillator thus controlling the alternating current for the local oscillator thereby synchronizing its frequency and phase with the TV frequency and phase.

6 Claims, 2 Drawing Figures

INVENTOR.
GERHARD A. KLADDE
BY
H. H. Losche
ATTORNEY

AUTOMATIC PHASE CONTROL CIRCUIT FOR TV SYSTEM

BACKGROUND OF THE INVENTION

This invention relates to phase and frequency control of a local oscillator frequency and more particularly to a circuit means to control the effective capacitance in an L–C tank circuit to control the frequency and phase of the local oscillator to synchronize them with the frequency and phase of a TV horizontal sweep frequency.

Automatic phase control circuitry is normally used to synchronize the frequency and phase of a TV horizontal sweep to that of the source, such as a vidicon. Past practice has been to use a discriminator to develop an error direct current (D.C.) signal which in turn controls the frequency of an astable multivibrator directly or utilizes reactance modulation of an L–C oscillator. These methods were not fully effective to produce highly efficient control but an improvement to the reactance modulation system for frequency and phase control of the local L–C oscillator appeared to be most desirable.

SUMMARY OF THE INVENTION

In this invention the capacitive reactance of the L–C tank circuit controlling the frequency and phase of a local oscillator is controlled in its effective capacitive reactance in one embodiment by using the discriminator D.C. error signal to control the negative resistance of a unijunction transistor to control the voltage on the tank circuit. In another embodiment the combination of operational amplifiers and a varactor bridge provides a multiplier to produce an in-phase voltage, a null voltage, or an out-of-phase voltage to change the effective capacitance in the L–C tank circuit. It is accordingly an object of this invention to provide a circuit to change the effective capacitive reactance of an L–C tank circuit coupled to control the frequency and phase of a local oscillator to synchronize the frequency and phase thereof with a TV horizontal sweep frequency.

BRIEF DESCRIPTION OF THE DRAWINGS

These and other objects and the attendant advantages, features and uses will become more apparent to those skilled in the art as a more detailed description proceeds when considered along with the accompanying drawing in which.

DESCRIPTION OF THE FIGURE 1 EMBODIMENT

Figure 1:
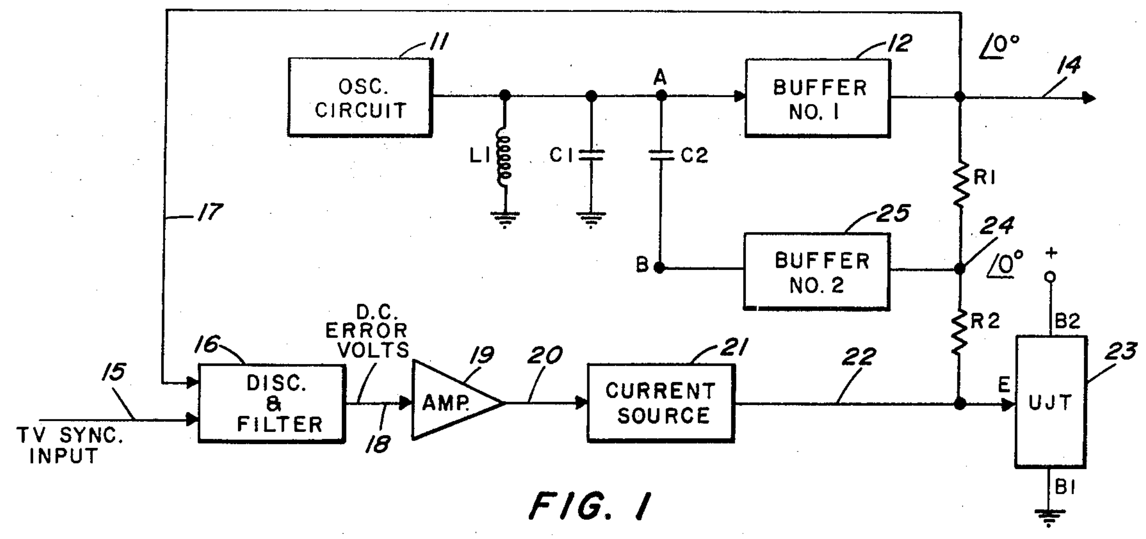
FIG. 1 is a block circuit schematic partially in circuit detail of one embodiment of the invention.

Referring more particularly to FIG. 1 a local oscillator circuit 11 has a tank circuit, shown externally herein for the purpose of description, consisting of an inductance L1, capacitance C1, and capacitor C2 on the output of the oscillator through a buffer amplifier No. 1 bearing the reference character 12. The buffer amplifier 12 is a unitary gain amplifier for isolation and has an output 14 which output is desirable to keep in exact synchronism with a TV sync input as a reference signal applied by the input conductor 15. The tank circuit L1,C1,C2 has L1 and C1 coupled to ground while the capacitor C2 is coupled between a terminal A on the output of the oscillator and a terminal B. Automatic frequency and phase control are ordinarily produced by the L–C circuitry for the local oscillator by either changing the inductance L or the effective capacitance of the tank circuit. The frequency of the local oscillator 11 can be changed by altering the effective value chosen to be the capacitance in the tank circuit herein by changing the voltage of point B. If the value of signal at point B is zero, being ground or null, then the effective tank circuit capacity $C$ is equal to $C1 + C2$. If the signal at point A is noted to be $1.0\angle 0°$ and the signal at point B is supplied by the control circuitry is noted to be $0.5\angle 0°$ then the effective tank circuit capacity becomes $C = C1 + C2/2$. Similarly the signal at point B could have had the value $0.5\angle 180°$ and the effective tank circuit capacity would now become $C = C1 + 3/2C2$. Thus the tank frequency is readily changed by the application of varying amounts of in-phase or out-of-phase signal voltage at point B.

The TV sync input 15 is coupled as one input to a discriminator and filter circuit 16, a second input to this discriminator being by way of a branch conductor 17 from the output 14 of the buffer 12. The discriminator and filter circuit 16 will produce a D.C. error voltage on its output 18 proportional to any frequency or phase difference between the local oscillator output 17 and the TV sync input 15. The D.C. error voltage is amplified in the amplifier 19 and applied by way of the output conductor 20 to the control input of a current source 21 producing a current output proportional to the amplified D.C. error voltage on its output 22. The output 22 of the current source is coupled to the emitter of a unijunction transistor (UJT) 23 having its first and second bases coupled in a voltage supply circuit. The output 14 of the buffer amplifier 12 is also coupled through a resistor R1 in series with a resistor R2 to the emitter terminal of the UJT 23. The junction of the resistors R1 and R2 at terminal 24 is coupled through a buffer amplifier No. 2 of unity gain for isolation and designated herein by the reference character 25, to the terminal point B. As well known the UJT is capable of producing a negative resistance characteristic in proportion to emitter current. When a certain current range is passed in the UJT, the voltage produces a quick drop thereby producing a negative resistance which, for the purposes disclosed herein, is in series with resistances R1 and R2. Accordingly, as the D.C. error voltage occurs on the output 18 of the discriminator and filter circuit 16 in either polarity, depending on the phase relation on the inputs 15 and 17 thereto, the current source 21 will be controlled to produce a current through the emitter of the UJT 23 proportional to this error voltage which will vary inphase the voltage at 24 and consequently at the terminal B to change the effective capacitance of the tank circuit L1,C1,C2 to correct the local oscillator 11 to synchronize its output strictly with the TV sync input at 15. For example, the voltage at point B may be written in the equation as $$e = \frac{R2 - R}{R1 + R2 - R} \times E$$

R is the absolute value of negative resistance.

If we assume the values of 5,000 ohms for R1 and 7,000 ohms for $R2$ and a negative resistance of −2,000 ohms from the UJT, the value at point B becomes $e = 0.5E$. Accordingly, by employing the discriminator error signal to control the current into the UJT it can effectively control its value of negative resistance and the amplitude of the in-phase signal sent back to point B by control of the current from conductor 14 to ground controlling the in-phase voltage amplitude at terminal 24. The tank frequency is thus controllable and the application of general feedback techniques around the loop results in an effective automatic phase and frequency control of the local oscillator circuit 11 in synchronism with TV input signal 15. By this means the local oscillator of a TV circuit, or the like, can be accurately controlled with the use of the TV sync input signal. The net effective value of C2 can be controlled in only one direction, however, but the value of C2 can range from the maximum value of the capacitor C2 when signal at point B is zero to a minimum value of capacitance when point B has maximum zero phase $\angle 0°$ signal applied. This circuitry permits the effective value of C2 to vary over much wider limits such as $0 < C_{eff} < 2C_2$. Normal practice would probably require only an upward swing of $C_{eff}$ to double the body value or down to zero.

DESCRIPTION OF THE FIGURE 2 EMBODIMENT

Figure 2:
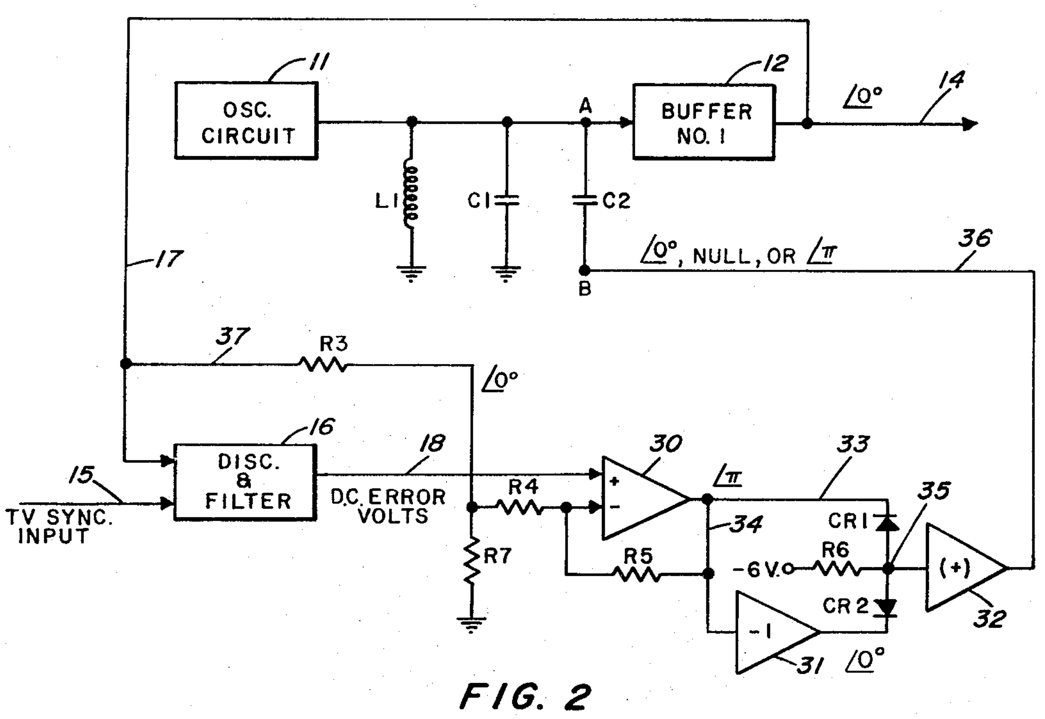
FIG. 2 is a circuit schematic partly in block of a second embodiment of the invention.

Referring more particularly to FIG. 2, where like reference characters are applied to like parts, a local oscillator circuit 11 has a tank circuit L1,C1,C2 coupled to the output end, and an output coupled through a buffer amplifier 12 to an output conductor 14, as hereinbefore described for FIG. 1. Also in like manner as in FIG. 1, a TV sync input is applied over conductor 15 to a discriminator and filter circuit 16 along with the output of the local oscillator over conductor 17 to produce the D. C. error voltage on the output 18, all as shown and described for FIG. 1. In this figure however, the output 18 of the discriminator circuit 16 is coupled to a multiplier circuit consisting of three operational amplifiers 30, 31, and 32 and a varactor divider bridge circuit consisting of a pair of anode-to-anode diodes CR1 and CR2. The output 33 of the operational amplifier 30 is coupled to the cathode of CR1 and by branch conductor 34 as an input to the operational amplifier 31. The operational amplifier 31 has its output coupled to the cathode of CR2. The common anode coupling of CR1 and CR2, constituting the varactor divider circuit, is coupled to a terminal point 35 to which is coupled a voltage source, such as −6 volts through a resistor R6. Terminal 35 in the varactor circuit is coupled through the operational amplifier 32 by way of conductor 36 to terminal point B. The output 14 of the buffer amplifier and local oscillator circuit is coupled by way of the branch circuit 17, the branch circuit 37, through resistors R3 and R7 to ground. The junction of resistors R3 and R7 is coupled through a resistor R4 as a second input to the operational amplifier 30. A feedback from 33 is provided through a resistor R5 to the input of the operational amplifier 31. By this means a portion of the local oscillator 11 output is coupled through R3 and R4 to develop a small amount of out-of-phase signal at the output of the operational amplifier 30 and designated herein by the symbol $\angle\pi$. The operational amplifier 31 inverts the output of the operational amplifier 30 to produce a $\angle 0°$ phase signal. These two out-of-phase signals from the operational amplifiers 30 and 31 will be equal and opposite in the absence of any D.C. error voltage from 16 applied to the varactor divider circuit CR1,CR2 which will establish a null at terminal 35 which will be applied by appropriate gain through the operational amplifier 32 and conductor 36 to the point B of the local oscillator tank circuit. Any deviation of the local oscillator 11 phase or frequency will be discriminated in 16 to produce a D.C. error voltage, positive or negative, depending on the phase relation to produce a push-pull signal through the operational amplifiers 30 and 31 to produce an unbalance in the varactor divider thereby producing a signal at 35 which will be in-phase or out-of-phase with the local oscillator 11 frequency applied to point B. Accordingly, it may be seen that a null voltage, in-phase voltage, or out-of-phase voltage can be applied to point B which will be operative in the tank circuit to correct the local oscillator circuit 11 to synchronize the output oscillations over 14 with the TV sync input 15. As in FIG. 1 the effective value of C2 can be controlled as a function of discriminator polarity and amplitude and the local oscillator 11 can be brought into both frequency and phase coherence with the incoming TV sync signal at 15.

While many modification and changes may be made in the constructional details to further carry out the spirit of this invention, I desire to be limited in the scope of my invention only by the scope of the appended claims.

I claim:

1. An automatic frequency and phase control circuit for synchronizing the frequency and phase of a horizontal sweep frequency comprising:

a local oscillator and a tank circuit coupled in combination, said tank circuit consisting of an inductance and first capacitance coupled in parallel to ground and a second capacitor coupled to a control tap to produce a frequency on an output established by the tank circuit timing limitations;

a discriminator and filter circuit having two inputs and an output, one input coupled to said output of said local oscillator and another input adapted to be coupled to a horizontal sweep frequency for discriminating the two frequencies to produce a direct current voltage proportional to any error between said two frequencies; and a circuit means coupled to the output of said discriminator and filter circuit to develop a phased signal voltage applied to said control tap of said tank circuit to control the effective capacitance of the second capacitor therein to control said local oscillator to produce a frequency and phase of oscillations synchronized with any horizontal sweep input frequency.

2. An automatic frequency and phase control circuit as set forth in claim 1 wherein said local oscillator output includes a first buffer amplifier to provide good isolation between said local oscillator and said discriminator.

3. An automatic frequency and phase control circuit as set forth in claim 2 wherein said circuit means includes a unijunction transistor coupled through a resistance divider and a second buffer amplifier to said control tap of said tank circuit and coupled from the output of said discriminator through a current source to produce a negative resistance proportional to the direct current error voltage for application to said tank circuit.

4. An automatic frequency and phase control circuit as set forth in claim 3 wherein said resistance divider consists of one resistance coupled between the output of said first buffer amplifier and the input of said second buffer amplifier and a second resistor coupled between the emitter of said unijunction transistor and the input of said second buffer amplifier in common with the output of said current source.

5. An automatic frequency and phase control circuit as set forth in claim 2 wherein said circuit means includes first and second operational amplifiers with inputs from said discriminator and filter circuit and from said first buffer amplifier, and with outputs coupled through a varactor bridge and a third operational amplifier to said tank circuit.

6. An automatic frequency and phase control circuit as set forth in claim 5 wherein said first operational amplifier has one input coupled to the output of said discriminator and filter and another input coupled to the output of said first buffer amplifier through a third resistance, the output of said first operational amplifier being to said second operational amplifier and to said varactor bridge in common and the output of said second operational amplifier being to said varactor bridge, said varactor bridge being biased at a non-zero voltage, to develop a small amount of $\pi$ phase signal and zero phase signal at the outputs of said first and second operational amplifiers, and the outputs of said first and second operational amplifiers to said varactor bridge being proportional to the error voltage to produce said phased signal voltage for said tank circuit.

* * * * *